United States Patent [19]

Springthorpe et al.

[11] Patent Number: 4,889,830
[45] Date of Patent: Dec. 26, 1989

[54] ZINC DIFFUSION IN THE PRESENCE OF CADMIUM INTO INDIUM PHOSPHIDE

[75] Inventors: Anthony J. Springthorpe, Richmond; Agnes Margittai, Ottawa; David Eger, Ottawa, all of Canada

[73] Assignee: Northern Telecom Limited, Montreal, Canada

[21] Appl. No.: 243,138

[22] Filed: Sep. 9, 1988

Related U.S. Application Data

[63] Continuation of Ser. No. 119,274, Nov. 9, 1987, abandoned, which is a continuation of Ser. No. 797,327, Nov. 12, 1985, abandoned.

[51] Int. Cl.$^4$ ............................................. H01L 21/223
[52] U.S. Cl. ..................................... 437/167; 437/151; 437/168; 437/3; 437/5; 148/DIG. 40; 252/950
[58] Field of Search ................... 252/950, 951; 437/3, 437/5, 150, 151, 165, 167, 168, 987; 148/DIG. 30, DIG. 40

[56] References Cited

U.S. PATENT DOCUMENTS 3,485,685 12/1969 Casey et al. ........................ 252/950
3,573,114 3/1971 Marinace ............................ 437/151
3,802,969 4/1974 Marinace ............................ 437/167
4,477,964 10/1984 Chin et al. ............................ 437/3

OTHER PUBLICATIONS

Chand et al., "Diffusion of Cd and Zn in InP Between 550° and 650° C.," J. of Elect. Matls. vol. 11, No. 1, 1982, pp. 37–52.
Matsumoto, "Diffusion of Cd and Zn into InP and InGaAsP (Eg=0.95–1.35 eV)", Jap. J. Appl. Phys., vol. 22, No. 11, Nov. 1983, pp. 1699–1704.
Ando et al., "Low Temperature Zn–and Cd–Diffusion Profiles in InP and Formation of Guard Ring in InP Avalanche Photodiodes", IEEE Trans. on Electron Devices, vol. ED-29, No. 9, Sep. 1982, pp. 1408–1413.
Marinace, "EL Junctions by Co-Doping With More Than One Element," IBM Technical Disclosure Bulletin, vol. 11, No. 3, Aug. 1968, p. 324.

Primary Examiner—Olik Chaudhuri
Assistant Examiner—M. Wilczewski
Attorney, Agent, or Firm—Foley & Lardner, Schwartz, Jeffery, Schwaab, Mack, Blumenthal & Evans

[57] ABSTRACT

Zinc is diffused into indium phosphide in the presence of cadmium to prevent degradation of the indium phosphide surface.

10 Claims, No Drawings

ZINC DIFFUSION IN THE PRESENCE OF CADMIUM INTO INDIUM PHOSPHIDE

This application is a continuation, of application Ser. No. 119,274, filed Nov. 9, 1987, which is a continuation of Ser. No. 797,327, filed Nov. 12, 1985 both now abandoned.

BACKGROUND OF THE INVENTION

1. Field of the Invention

This invention relates to the diffusion of zinc into indium phosphide or into ternary or quaternary III-V systems based on indium phosphide.

2. Description of Related Art

In the manufacture of light sources and detectors for use in telecommunications, the quaternary system indium gallium arsenide phosphide has been extensively used. One of the reasons for this is that an indium gallium arsenide phosphide/indium phosphide double heterostructure laser has an emission wavelength which coincides with a low loss regime in silica based optical waveguides.

In the manufacture of indium gallium arsenide phosphide/indium phosphide devices such as lasers, LEDs and photodetectors, a commonly used process step is to diffuse zinc into the structure. In a laser, for example, the zinc diffusion provides a low resistance path from a subsequently formed laser top contact to a laser active region.

The zinc diffusion, which typically takes place at 500° C. for a period of about 2 hours, degrades the substrate surface. In particular phosphorus loss causes etch pits to appear on the crystal surface and these pits detract from crystal integrity of subsequent epitaxial growth. In an attempt to reduce surface damage it is known to diffuse zinc in the presence of phosphorus vapour. However if the partial pressure of phosphorus is too high, there is minimal zinc diffusion.

SUMMARY OF THE INVENTION

In order to reduce the incidence of surface degradation of an indium phosphide based III-V semiconductor material, a method according to the present invention comprises diffusing zinc into the indium phosphide system material in the presence of cadmium.

DESCRIPTION OF PREFFERRED EMBODIMENTS

An embodiment of the invention will now be described by way of example.

A zinc-in-gallium source is located in a first quartz chamber and a cadmium-in-indium source is disposed in a second quartz chamber. The chambers are heated and the zinc and cadmium vapours are fed into a box-diffusion chamber within which is located a sulphur doped indium phosphide substrate. Zinc diffuses into the indium phosphide. In contrast, cadmium appears not to diffuse into the indium phosphide at temperatures at which zinc diffusion is normally carried out but acts to inhibit surface degradation of the indium phosphide substrate surface.

In the zinc diffusion procedure, several process parameters were varied. Thus the cadmium content in 2.2 grams of indium was varied from 0 to 1000 milligrams. Also substrates having two n-type dopant levels were used, these being $10^{18}$ and $10^{19}$ carriers per cubic centimeter. Finally the diffusion temperature was varied from 480° C. to 650° C.

EXAMPLE 1

Zinc was diffused into indium phosphide doped to a level of $10^{19}/cm^3$ at 600° C. for a period of 1 hour. With no cadmium present the wafer top surface was found to have a thermal etch pit density of $10^7$ cm$^{-2}$. With 10 milligrams of cadmium, the etch pit density was reduced to $10^5$ cm$^{-2}$. At a cadmium level of 50 milligrams, the etch pit density was about $5 \times 10^4$ cm$^{-2}$.

Example 2

Zinc was diffused at 525° C. for 1 hour. With no cadmium present, the wafer top surface had an etch pit density greater than $10^6$ cm$^{-2}$. A large variation of pit area results with some pits exceeding 1 mm$^2$. With 10 milligrams of cadmium, the etch pit density was reduced to less than 100 cm$^{-2}$. The average size of pits is 100 square microns.

The Examples show that optimum surface morphology is obtained with a ratio of about 10 milligrams of cadmium to 2.2 grams of indium, the weight of cadmium somewhat greater at higher temperatures.

The invention finds particular application in the manufacture of buried heterostructure semiconductor laser devices in which epitaxial growth follows the diffusion of zinc.

The reduction of surface degradation is achieved with indium phosphide III-V materials which are doped with other dopants such as tin and iron and also with undoped semiconductors. Although in the specific example, diffusion takes place into a substrate material, the method is also advantageous for diffusing into epitaxial layers.

It is also noteworthy that in the presence of cadmium, the zinc diffusion depth is reduced for a given diffusion time, temperature and substrate dopant level. Since the diffusion depth is dependent on the amount of cadmium, the introduction of cadmium affords an effective vehicle for controlling diffusion depth.

What is claimed is:

1. A method of inhibiting surface degradation of a phosphorous-containing group III-V semiconductor substrate during zinc diffusion into said substrate, the method comprising contacting said substrate with a mixture consisting essentially of elemental zinc vapor and elemental cadmium vapor and diffusing elemental zinc vapor into said substrate in the presence of said elemental cadium vapor at a temperature whereby only zinc detectably diffuses into said substrate and surface degradation is inhibited.

2. A method as claimed in claim 1 in which the semiconductor is indium phosphide.

3. A method as claimed in claim 1 in which the semiconductor contains both indium and phosphorus.

4. A method as claimed in claim 1 in which the semiconductor is indium gallium arsenide phosphide.

5. A method as claimed in claim 1 in which the cadmium is derived from a cadmium-in-indium source.

6. A method as claimed in claim 5 wherein about 10 milligrams of cadmium are used for each 2.2 grams of indium.

7. A method as claimed in claim 1 in which the zinc is derived from a zinc-in-gallium source.

8. A method as claimed in claim 1 wherein for a predetermined diffusion temperature and diffusion time, an amount of cadmium is specifically selected to give a desired zinc diffusion depth.

9. A method as claimed in claim 1 wherein the diffusion is conducted at about 600° C. for about one hour.

10. A method as claimed in claim 1 wherein the diffusion is conducted at about 525° C. for about one hour.

* * * * *